(12) United States Patent
Chang et al.

(10) Patent No.: US 9,054,180 B2
(45) Date of Patent: Jun. 9, 2015

(54) SEMICONDUCTOR DEVICES INCLUDING A GUARD RING AND RELATED SEMICONDUCTOR SYSTEMS

(71) Applicants: Hoon Chang, Suwon-si (KR); Dong-Eun Jang, Seoul (KR)

(72) Inventors: Hoon Chang, Suwon-si (KR); Dong-Eun Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 150 days.

(21) Appl. No.: 13/711,156

(22) Filed: Dec. 11, 2012

(65) Prior Publication Data

US 2013/0265086 A1 Oct. 10, 2013

(30) Foreign Application Priority Data

Apr. 6, 2012 (KR) ........................ 10-2012-0036187

(51) Int. Cl.
| | |
|---|---|
| *H01L 29/66* | (2006.01) |
| *H01L 29/78* | (2006.01) |
| *H01L 29/06* | (2006.01) |
| *H03K 17/687* | (2006.01) |
| *H01L 21/8234* | (2006.01) |
| *H01L 27/092* | (2006.01) |
| *H01L 29/08* | (2006.01) |
| *H01L 29/10* | (2006.01) |

(52) U.S. Cl.
CPC ........ *H01L 29/7816* (2013.01); *H01L 29/0657* (2013.01); *H03K 17/687* (2013.01); *H01L 21/823481* (2013.01); *H01L 21/823493* (2013.01); H01L 27/0921 (2013.01); *H01L 29/7835* (2013.01); *H01L 29/0619* (2013.01); H01L 29/0653 (2013.01); H01L 29/0878 (2013.01); H01L 29/1045 (2013.01); *H01L 29/1083* (2013.01); *H01L 29/1087* (2013.01); H01L 29/1095 (2013.01)

(58) Field of Classification Search
CPC ............ H01L 29/0619; H01L 29/0623; H01L 29/7811; H01L 29/7823
USPC ........................................................ 257/328
See application file for complete search history.

(56) References Cited

U.S. PATENT DOCUMENTS

| | | |
|---|---|---|
| 4,618,872 A | 10/1986 | Baliga |
| 5,488,236 A | 1/1996 | Baliga et al. |
| 5,543,637 A | 8/1996 | Baliga |
| 5,681,762 A | 10/1997 | Baliga |
| 5,895,940 A | 4/1999 | Kim |
| 5,950,076 A | 9/1999 | Baliga |
| 5,986,863 A | 11/1999 | Oh |
| 6,075,259 A | 6/2000 | Baliga |
| 6,548,839 B1 | 4/2003 | Strachan et al. |
| 6,716,679 B2 | 4/2004 | Bae |
| 6,729,886 B2 | 5/2004 | Efland et al. |
| 6,809,397 B2 | 10/2004 | Bae |
| 6,924,531 B2 | 8/2005 | Chen et al. |
| 6,933,559 B1 | 8/2005 | Van Roijen et al. |
| 7,888,222 B2 | 2/2011 | You et al. |

(Continued)

*Primary Examiner* — Andy Huynh
*Assistant Examiner* — Sitaramarao S Yechuri
(74) *Attorney, Agent, or Firm* — Myers Bigel Sibley & Sajovec, PA

(57) ABSTRACT

Semiconductor devices are provided. The semiconductor devices may include a substrate and a transistor on the substrate. The semiconductor devices may include a first guard ring of first conductivity type in the substrate adjacent the transistor. The semiconductor devices may include a second guard ring of second conductivity type opposite the first conductivity type in the substrate adjacent the first guard ring. Related semiconductor systems are also provided.

13 Claims, 12 Drawing Sheets

(56) References Cited

U.S. PATENT DOCUMENTS

| | | | |
|---|---|---|---|
| 8,026,549 B2 | 9/2011 | Chen et al. | |
| 2004/0238913 A1* | 12/2004 | Kwon et al. | 257/492 |
| 2005/0073007 A1* | 4/2005 | Chen et al. | 257/355 |
| 2008/0128828 A1* | 6/2008 | Nakamura | 257/393 |
| 2008/0315308 A1 | 12/2008 | Huang et al. | |
| 2009/0101937 A1* | 4/2009 | Lee et al. | 257/137 |
| 2009/0236662 A1 | 9/2009 | Voldman | |
| 2010/0140703 A1* | 6/2010 | Ko | 257/343 |
| 2010/0164650 A1* | 7/2010 | Abou-Alfotouh et al. | 333/181 |
| 2010/0289057 A1* | 11/2010 | Sheu et al. | 257/133 |

* cited by examiner

2000

2100

US 9,054,180 B2

SEMICONDUCTOR DEVICES INCLUDING A GUARD RING AND RELATED SEMICONDUCTOR SYSTEMS

CROSS-REFERENCE TO RELATED APPLICATION

This U.S. non-provisional application claims priority under 35 U.S.C. §119 to Korean Patent Application No. 10-2012-0036187, filed on Apr. 6, 2012, the disclosure of which is hereby incorporated by reference in its entirety.

BACKGROUND

The present disclosure relates to semiconductor devices including a guard ring.

A semiconductor system, such as a system on chip (SOC), a microcontroller unit (MCU), a display driver IC (DDI), or a power management IC (PMIC) may include a processor, a memory, and/or a plurality of peripheral devices such as a logic circuit, a voice and picture processing circuit, and/or various interfacing circuits.

Meanwhile, the semiconductor system may include a power transistor that transmits power. A parasitic bipolar transistor (e.g., a parasitic NPN transistor or a parasitic PNP transistor) in the power transistor, however, may provide a parasitic current resulting in noise on other circuit blocks, and may generate latch-up (e.g., current leakage and/or circuit failure).

SUMMARY

According to various embodiments of the present inventive concepts, semiconductor devices are provided that may include a transistor on a substrate. The transistor may include a gate electrode, a source electrode, and a drain electrode. The semiconductor devices may include a first guard ring, of a first conductivity type, in the substrate adjacent the transistor. The semiconductor devices may include a second guard ring, of a second conductivity type that is different from (e.g., opposite) the first conductivity type, in the substrate adjacent the first guard ring. The first guard ring may be configured to receive a bias. The second guard ring may be configured to receive the same (e.g., an equivalent) bias as the first guard ring. At least one of the source electrode and the drain electrode may be configured to receive the same (e.g., an equivalent) bias as the first and second guard rings.

In various embodiments, the semiconductor devices may include a third guard ring, of the first conductivity type, that is closer to the second guard ring than to the first guard ring. The bias of the first guard ring may be a first bias. The third guard ring may be configured to receive a second bias that is different from the first bias.

According to various embodiments, the first bias may be one of a ground voltage and a power voltage, and the second bias may be the other one of the ground voltage and the power voltage.

In various embodiments, the first guard ring may form a perimeter around the transistor, and the second guard ring may form a perimeter around the first guard ring.

According to various embodiments, the substrate may include a base substrate and an epi layer of different (e.g., opposite) respective conductivity types. A portion of the first guard ring and a portion of the base substrate may overlap each other.

In various embodiments, the semiconductor devices may include a buried layer, of the second conductivity type, under the second guard ring in the substrate such that a portion of the second guard ring and a portion of the buried layer overlap each other.

According to various embodiments, a depth of the first guard ring may be greater in the substrate than a depth of the second guard ring.

In various embodiments, the transistor may include an N-type lateral double diffused metal oxide semiconductor (LDMOS) transistor. The bias may be a ground voltage. The source electrode may include first and second source electrodes on opposite sides of the drain electrode, respectively. In some embodiments, the first guard ring may be closer to the source electrode than to the drain electrode.

According to various embodiments, the transistor may include a P-type lateral double diffused metal oxide semiconductor (LDMOS) transistor. The bias may be a power voltage. The source electrode may include first and second source electrodes on opposite sides of the drain electrode, respectively. In some embodiments, the first guard ring may be closer to the source electrode than to the drain electrode.

In various embodiments, the transistor may include an N-type lateral double diffused metal oxide semiconductor (LDMOS) transistor. The bias may be a power voltage. The drain electrode may include first and second drain electrodes. The source electrode may be between the first and second drain electrodes. In some embodiments, the first guard ring may be closer to the drain electrode than to the source electrode.

Semiconductor devices according to various embodiments may include a transistor and a first guard ring, of a first conductivity type, that forms a perimeter around the transistor and that is configured to receive a first bias. The semiconductor devices may include a second guard ring, of a second conductivity type that is different from (e.g., opposite) the first conductivity type, that forms a perimeter around the first guard ring and that is configured to receive the first bias. The semiconductor devices may include a third guard ring, of the first conductivity type, that forms a perimeter around the second guard ring and that is configured to receive a second bias that is different from the first bias.

In various embodiments, the transistor may include an N-type lateral double diffused metal oxide semiconductor (LDMOS) transistor. The second bias may be greater than the first bias. The transistor may include a source electrode that is configured to receive the first bias.

According to various embodiments, the transistor may include an N-type lateral double diffused metal oxide semiconductor (LDMOS) transistor. The first bias may be greater than the second bias. The transistor may include a drain electrode that is configured to receive the first bias.

In various embodiments, the transistor may include a P-type lateral double diffused metal oxide semiconductor (LDMOS) transistor. The first bias may be greater than the second bias. In some embodiments, the first bias may be a power voltage and the second bias may be a ground voltage. Some embodiments provide that the transistor may include a source electrode that is configured to receive the first bias.

Semiconductor devices according to various embodiments may include a substrate and a lateral double diffused metal oxide semiconductor (LDMOS) transistor that is on the substrate and that is configured to transmit a signal through movement of carriers. The semiconductor devices may include a first guard ring that is in the substrate and that forms a perimeter around the transistor. The semiconductor devices may include a second guard ring that is in the substrate and that forms a perimeter around the first guard ring. The semiconductor devices may include a third guard ring that is in the substrate and that forms a perimeter around the second guard ring. A potential level of the second guard ring may be different from respective potential levels of the first and third guard rings. The second guard ring may be configured to provide a potential barrier that impedes movement of the carriers from the first guard ring to the third guard ring.

Semiconductor systems according to various embodiments may include a gate driver and a power stage connected to the gate driver and controlled by the gate driver. The power stage may include first and second transistors connected in series, a first guard ring of a first conductivity type, and a second guard ring of a second conductivity type. The first guard ring may form a perimeter around the first transistor, the second guard ring may form a perimeter around the first guard ring, and the first and second guard rings may be configured to receive the same (e.g., an equivalent) bias.

In various embodiments, the bias may be a first bias. The power stage may include a third guard ring of the first conductivity type. The third guard ring may form a perimeter around the second guard ring and may be configured to receive a second bias that is different from the first bias.

According to various embodiments, the gate driver may include a first gate driver. The semiconductor system may include a second gate driver. The power stage may include a first power stage. The semiconductor systems may include a second power stage that is connected to the second gate driver and is controlled by the second gate driver. The second power stage may include third and fourth transistors connected in series and third and fourth guard rings of different (e.g., opposite) respective conductivity types. The third guard ring may form a perimeter around the third transistor. The fourth guard ring may form a perimeter around the third guard ring. The third and fourth guard rings may each be configured to receive the same (e.g., an equivalent) bias.

In various embodiments, the semiconductor systems may include an inductor that includes first and second ends, the first end connected to an output terminal of the first power stage and the second end connected to an output terminal of the second power stage.

According to various embodiments, the semiconductor systems may include a power management IC (PMIC).

Semiconductor devices according to various embodiments may include a first guard ring of a first conductivity type, the first guard ring forming a perimeter around a transistor on a substrate and being configured to provide a first potential level. The semiconductor devices may include a second guard ring of a second conductivity type that is different from (e.g., opposite) the first conductivity type, the second guard ring forming a perimeter around the first guard ring and being configured to provide a second potential level that is different from the first potential level.

In various embodiments, the first and second guard rings may be configured to simultaneously receive the same (e.g., an equivalent) bias.

According to various embodiments, the semiconductor devices may include a third guard ring of the first conductivity type, the third guard ring forming a perimeter around the second guard ring and being configured to receive a bias different from the bias that the first and second guard rings are configured to receive.

In various embodiments, the semiconductor devices may include a buried layer of the second conductivity type that is between the substrate and the first and second guard rings.

According to various embodiments, the second guard ring may have a more shallow depth in the substrate than a depth of the first guard ring in the substrate.

BRIEF DESCRIPTION OF THE DRAWINGS

The above and other features and advantages of the disclosure will become more apparent in view of the attached drawings and accompanying detailed description.

DETAILED DESCRIPTION

Figure 1:
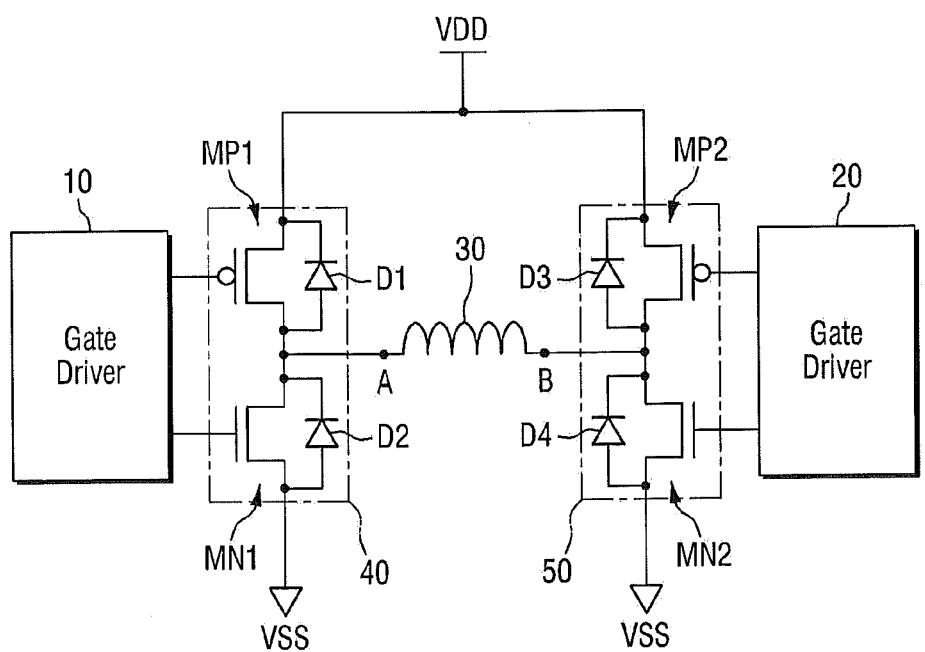
FIG. 1 is a circuit diagram of a semiconductor device, according to various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
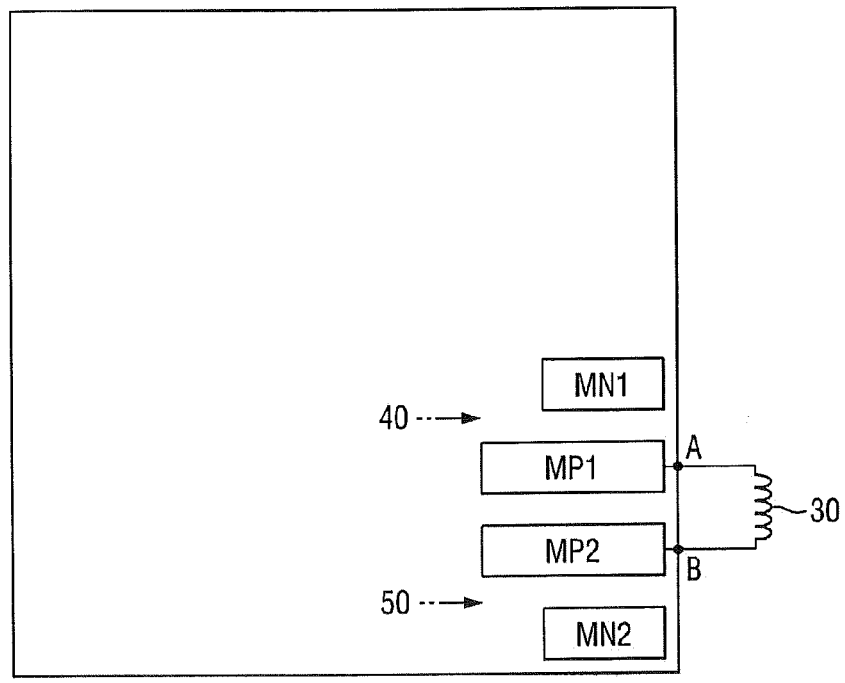
FIG. 2 is a block diagram of an example of the semiconductor device of FIG. 1, according to various embodiments of the present inventive concepts.

FIGS. 1 to 5 illustrate a semiconductor device according to various embodiments of the present inventive concepts. In particular, FIG. 1 is a circuit diagram of a semiconductor device, FIG. 2 is a block diagram of an example of the semiconductor device of FIG. 1, and FIGS. 3 to 5 illustrate operations of the semiconductor device of FIG. 1, according to various embodiments of the present inventive concepts. Although the semiconductor device may be a DC-DC converter, the present disclosure is not limited thereto. Moreover, although FIG. 1 shows a full bridge power stage, the present disclosure is not limited thereto. For example, a half bridge switching regulator may be used.

Referring now to FIG. 1, a semiconductor device 100 according to various embodiments of the present inventive concepts may include a first gate driver 10, a second gate driver 20, a first power stage 40, and a second power stage 50.

The first power stage 40 may be connected to the first gate driver 10 and may be controlled by the first gate driver 10. The first power stage 40 may include a first transistor MP1 and a second transistor MN1. The first transistor MP1, which may operate as a pull up transistor, may be connected between a power voltage VDD and a first output node A and may be a lateral double diffused metal oxide semiconductor (LDMOS) transistor of a first conductivity type (e.g., P type). Alternatively, the first transistor MP1 may be a lateral double diffused MOS (LDMOS) transistor of a second conductivity type (e.g., N type), which may also be referred to as a high-side N-type LDMOS transistor. The second transistor MN1, which may operate as a pull down transistor, may be connected between the first output node A and a ground voltage VSS and may be an LDMOS transistor of the second conductivity type (e.g., N type). As illustrated in FIG. 1, a first parasitic diode D1 may be connected to the first transistor MP1 and a second parasitic diode D2 may be connected to the second transistor MN1. The first parasitic diode D1 and the second parasitic diode D2 may operate when the first transistor MP1 and the second transistor MN1 are turned off.

The second power stage 50 may be connected to the second gate driver 20 and may be controlled by the second gate driver 20. The second power stage 50 may include a third transistor MP2 and a fourth transistor MN2 connected in series. The third transistor MP2, which may operate as a pull up transistor, may be connected between the power voltage VDD and a second output node B and may be an LDMOS transistor of a first conductivity type (e.g., P type). Alternatively, the third transistor MP2 may be an LDMOS transistor of a second conductivity type (e.g., N type), which may also referred to as a high-side N-type LDMOS transistor. The fourth transistor MN2, which may operate as a pull down transistor, may be connected between the second output node B and the ground voltage VSS and may be an LDMOS transistor of the second conductivity type (e.g., N type). As illustrated in FIG. 1, a third parasitic diode D3 may be connected to the third transistor MP2 and a fourth parasitic diode D4 may be connected to the fourth transistor MN2. The third parasitic diode D3 and the fourth parasitic diode D4 may operate when the third transistor MP2 and the fourth transistor MN2 are turned off.

A parasitic bipolar transistor (e.g., a parasitic NPN transistor or a parasitic PNP transistor) may be included in a semiconductor device 100. Additionally or alternatively, an inductor 30 may be connected between the first output node A and the second output node B.

Referring now to FIG. 2, the first power stage 40 and the second power stage 50 may be implemented as one (e.g., a single/individual) semiconductor chip. In some embodiments, the inductor 30 may not be included in the implemented semiconductor chip. Some embodiments provide that the first gate driver 10, the second gate driver 20, the first power stage, 40 and the second power stage 50 may be implemented as one semiconductor chip.

Figure 3:
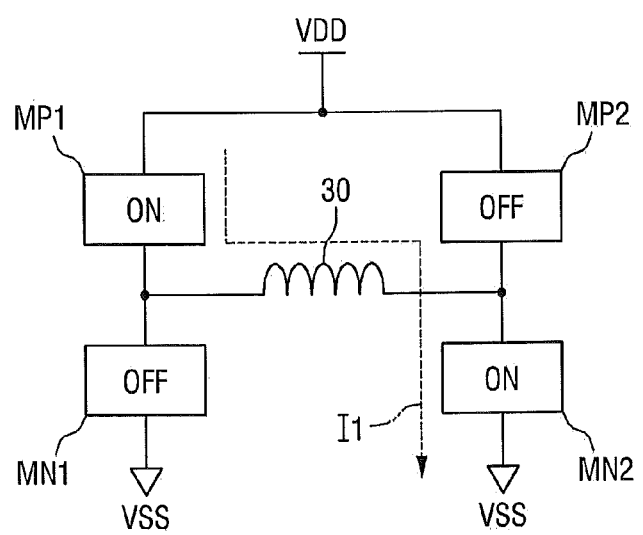
FIGS. 3 to 5 are block diagrams that illustrate operations of the semiconductor device of FIG. 1, according to various embodiments of the present inventive concepts.
Figure 4:
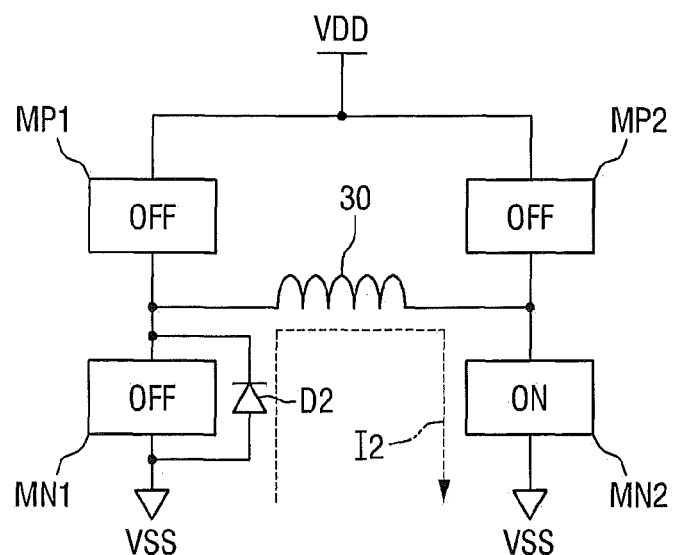
Figure 5:
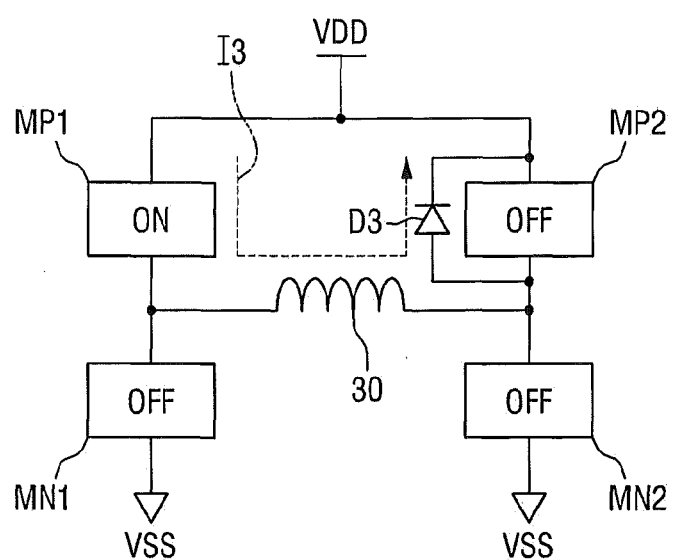

FIGS. 3 to 5 illustrate operations of the semiconductor device 100 according to various embodiments of the present inventive concepts. Referring to FIG. 3, for example, the first transistor MP1 and the fourth transistor MN2 may be turned on and the second transistor MN1 and the third transistor MP2 may be turned off. Accordingly, a current I1, which flows through the first transistor MP1, the inductor 30, and the fourth transistor MN2, is generated. The inductor 30 tends to maintain a current level. After the operations illustrated in FIG. 3, at least one of the first to fourth parasitic diodes D1 to D4 may operate.

For example, FIG. 4 shows a state in which only the fourth transistor MN2 is turned on after the operations shown in FIG. 3. To maintain a current flowing through the inductor 30, the second parasitic diode D2 is turned on. Therefore, a current I2, which flows through the second parasitic diode D2, the inductor 30, and the fourth transistor MN2, is generated.

In another example, FIG. 5 shows a state in which only the first transistor MP1 is turned on after the operations shown in FIG. 3. To maintain a current flowing through the inductor 30, the third parasitic diode D3 is turned on. Therefore, a current I3, which flows through the first transistor MP1, the inductor 30, and the third parasitic diode D3, is generated.

Meanwhile, when at least one of the first to fourth parasitic diodes D1 to D4 is turned on, a parasitic bipolar transistor may also be turned on. If the parasitic bipolar transistor is turned on, the current may flow through a parasitic bipolar transistor in an unwanted direction. In other words, the current flowing through the parasitic bipolar transistor may affect nearby/adjacent circuit elements/blocks.

The semiconductor device 100 according to various embodiments of the present inventive concepts, however, may include a guard ring that may block the current flowing through the parasitic bipolar transistor. Therefore, stable operation of the semiconductor device 100 can be achieved. For example, the semiconductor device 100 may stably operate by lowering a gain of the parasitic bipolar transistor.

Figure 6:
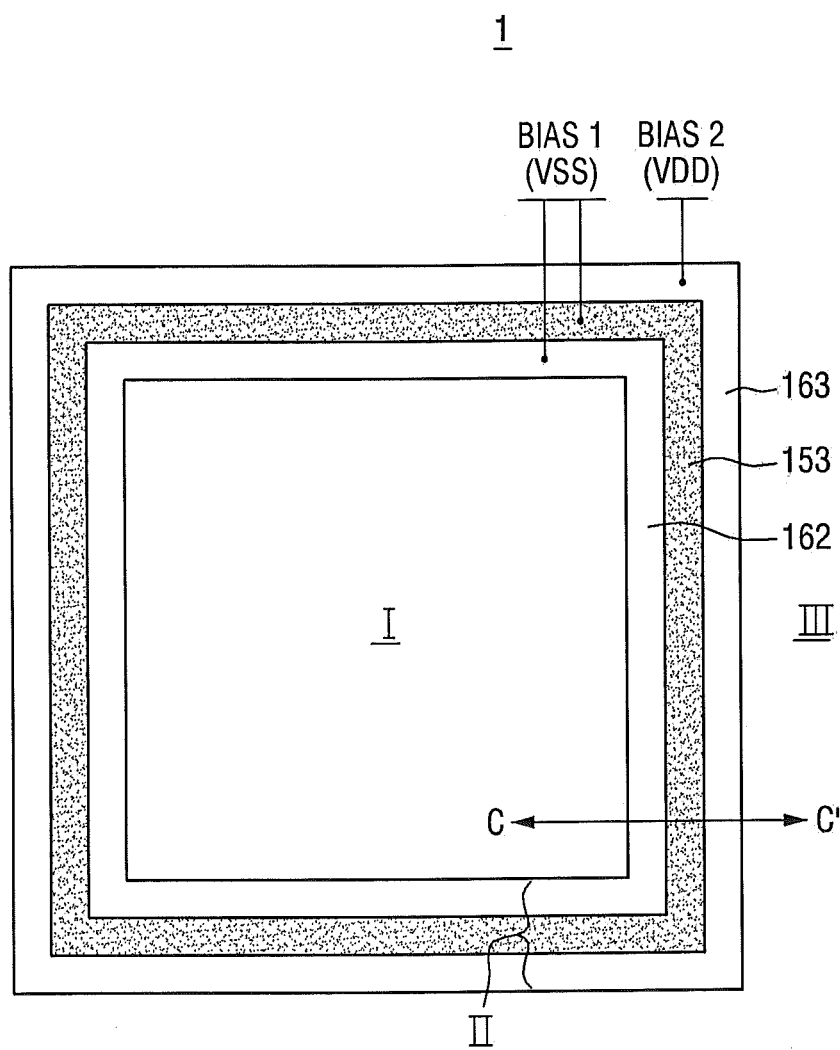
FIG. 6 is a plan view of a semiconductor device, according to various embodiments of the present inventive concepts.
Figure 7:
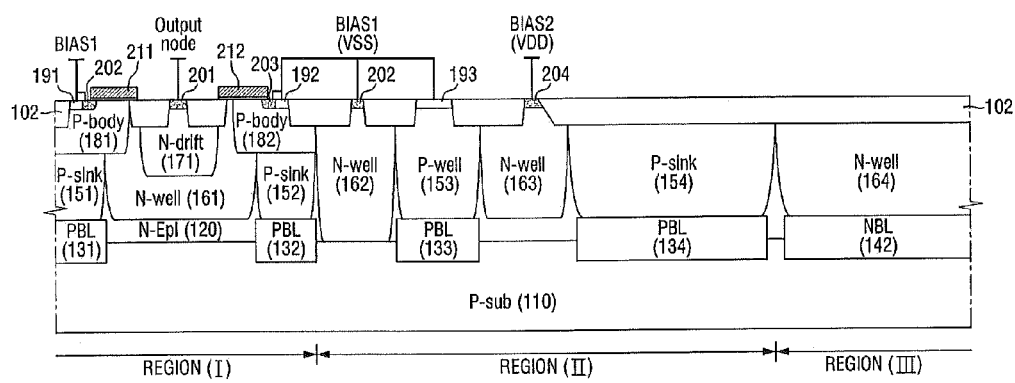
FIG. 7 is a cross-sectional view taken along the line C-C' of FIG. 6.
Figure 8:
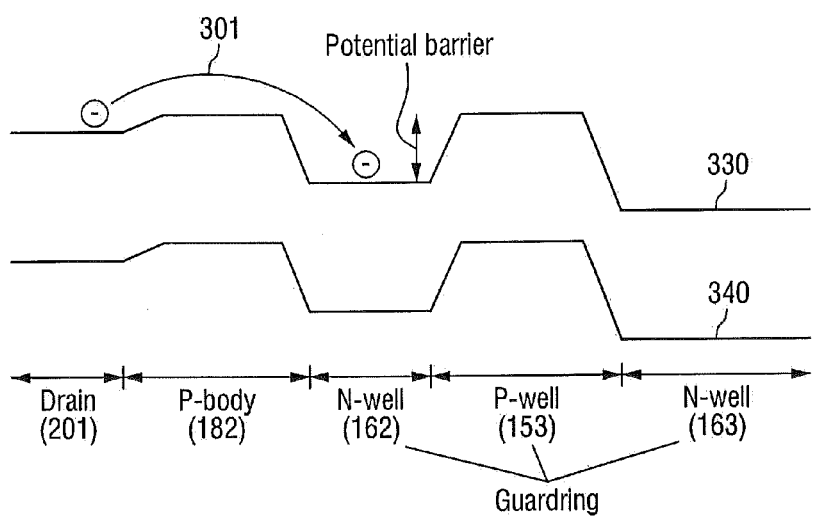
FIG. 8 is a potential diagram that illustrates operations of the semiconductor device of FIG. 7, according to various embodiments of the present inventive concepts.

FIG. 6 is a plan view of a semiconductor device 1, FIG. 7 is a cross-sectional view taken along the line C-C' of FIG. 6, and FIG. 8 is a potential diagram of operations of the semiconductor device 1, according to various embodiments of the present inventive concepts.

Referring to FIGS. 6 and 7, the semiconductor device 1 may include a first region I, a second region II, and a third region III. An LDMOS transistor may be formed in the first region I (e.g., a transistor formation region). For example, an LDMOS transistor of a second conductivity type (e.g., N type) may be formed in the first region I. The third region III may include a block region close to (e.g., adjacent) the first region I. The second region II is a region between the first region I and the third region III, and guard rings 162, 153, and 163 may be formed in the second region II.

Referring to FIG. 7, substrates 110 and 120 may include a base substrate 110 of a first conductivity type (e.g., P type) and an epi layer 120 of a second conductivity type (e.g., N type). For example, the base substrate 110 may include a silicon substrate, a gallium arsenide substrate, a silicon germanium substrate, a ceramic substrate, a quartz substrate, a glass substrate for display, or a semiconductor on insulator (SOI) substrate. As an alternative to the base substrate 110 and the epi layer 120 having different/opposite conductivity types, the epi layer 120 may have the same conductivity type as the base substrate 110 in some embodiments.

First buried layers 131, 132, 133, and 134 of a first conductivity type (e.g., P type) and a second buried layer 142 of second conductivity type (e.g., N type) may be formed in the substrates 110 and 120. For example, the first buried layers 131 and 132 may be formed in the first region I, the first buried layers 133 and 134 may be formed in the second region II, and the second buried layer 142 may be formed in the third region III. The first buried layers 131, 132, 133, and 134 may also be formed at a boundary between the base substrate 110 and the epi layer 120. In other words, some portions (e.g., lower portions) of the first buried layers 131, 132, 133, and 134 and the second buried layer 142 may be formed in the base substrate 110 and the remaining portions (e.g., upper portions) may be formed in the epi layer 120. For example, the first buried layers 131, 132, 133, and 134 and the second buried layer 142 may be formed on the base substrate 110, the epi layer 120 may be formed on the base substrate 110, and the first buried layers 131, 132, 133, and 134 and the second buried layer 142 may be diffused into the base substrate 110 and the epi layer 120 by a subsequent annealing process.

Sinks 151 and 152 of a first conductivity type may be formed in the first region I of the substrates 110 and 120, and a deep well 161 of a second conductivity type may be formed. As shown in FIG. 7, the sinks 151 and 152 may come into contact (e.g., physical contact) with the first buried layers 131 and 132, respectively. Accordingly, portions of the sinks 151 and 152 may overlap portions of the first buried layers 131 and 132, respectively. Additionally or alternatively, the first guard ring 162 may overlap a portion of the substrate 110.

An LDMOS transistor of a second conductivity type (e.g., N type) may include gate electrodes 211 and 212, a drain electrode 201, and source electrodes 202 and 203. The N-type LDMOS transistor used in the semiconductor device 1 according to various embodiments of the present inventive concepts may be a low-side N-type LDMOS transistor. As described herein, the "low-side" LDMOS transistor may refer to a pull down transistor (e.g., a pull down transistor shown in FIG. 1). In some embodiments, the drain electrode 201 may be formed in a drift region 171 of a second conductivity type, and the drift region 171 may be formed in a deep well 161. The drain electrode 201 may include a higher concentration of second conductivity type dopants than the drift region 171. Moreover, the drift region 171 may secure a breakdown voltage (BV) for a high voltage.

The source electrodes 202 and 203 may be formed in bodies 181 and 182 of a first conductivity type. The drain electrode 201 may be connected to an output node, and the source electrodes 202 and 203 may be connected to a first bias BIAS1. The first bias BIAS1 may be a ground voltage VSS, but is not limited thereto. As shown in FIG. 7, in an LDMOS transistor of a second conductivity type, the source electrodes 202 and 203 may be disposed on/at opposite sides (e.g., to the left and to the right, respectively) of the drain electrode 201, which may increase the current driving capacity of the LDMOS transistor. Ohmic contacts 191 and 192 of a first conductivity type may be portions to which the first bias BIAS1 is applied and may be formed close to (e.g., adjacent) the source electrodes 202 and 203 of the LDMOS transistor.

As described herein, the third region III may be a block region close to the first region I. As illustrated in FIG. 7, a well 164 of a second conductivity type may be formed in the third region III of the substrates 110 and 120, but is not limited thereto.

The first guard ring 162 of a second conductivity type (e.g., N type), the second guard ring 153 of a first conductivity type (e.g., P type), and the third guard ring 163 of the second conductivity type may be formed in the second region II of the substrates 110 and 120. The ohmic contact 202 of the second conductivity type may be formed on the first guard ring 162, the ohmic contact 193 of the first conductivity type may be formed on the second guard ring 153, and the ohmic contact 204 of the second conductivity type may be formed on the third guard ring 163. As described herein, N type conductivity may be referred to as being "opposite" P type conductivity, and vice versa.

The first guard ring 162 may be formed close to (e.g., adjacent) the LDMOS transistor, the second guard ring 153 may be formed close to (e.g., adjacent) the first guard ring 162, and the third guard ring 163 may be formed close to (e.g., adjacent) the second guard ring 153. As shown in FIG. 6, the first guard ring 162 may surround (e.g., form a perimeter around) the first region I in the substrate 110 and 120 where the LDMOS transistor is formed, and the first bias BIAS1 may be applied to first guard ring 162. The second guard ring 153 may surround (e.g., form a perimeter around) the first guard ring 162 in the substrates 110 and 120, and the first bias BIAS1 may be applied to the second guard ring 153. The third guard ring 163 may surround (e.g., form a perimeter around) the second guard ring 153 in the substrates 110 and 120, and a second bias BIAS2 (which may be different from the first bias BIAS1) may be applied to the third guard ring 163.

Meanwhile, referring to FIG. 7, given an N-type LDMOS transistor, the second bias BIAS2 may be greater than the first bias BIAS1. For example, the second bias BIAS2 may be a power voltage VDD and the first bias BIAS1 may be a ground voltage VSS, but aspects of the present inventive concepts are not limited thereto.

In addition, the first bias BIAS1 may be applied to the source electrodes 202 and 203 of the N-type LDMOS transistor. In other words, the first bias BIAS1 (i.e., the same/equivalent bias) may be simultaneously applied to the source electrodes 202 and 203, the first guard ring 162, and the second guard ring 153. However, the same bias is not necessarily to applied to the N-type LDMOS transistor source electrodes 202 and 203, the first guard ring 162, and the second guard ring 153.

In addition, a depth of the first guard ring 162 and a depth of the second guard ring 153 may be substantially the same, but aspects of the present inventive concepts are not limited thereto. For example, the depth of the first guard ring 162 may be greater than that of the second guard ring 153. The depth of the first guard ring 162 or the second guard ring 153 may be adjusted according to a processing condition or an operation characteristic.

Meanwhile, a deep well 161 of a second conductivity type, a body 182 of a first conductivity type (or the sink 152), and the first guard ring 162 may constitute a parasitic bipolar transistor. When a corresponding parasitic diode (for example, at least one of parasitic diodes D1 to D4 shown in FIG. 1) is turned on, the parasitic bipolar transistor may be turned on. Therefore, if the parasitic bipolar transistor is turned on, carriers (e.g., charges) may move from the drain electrode 201 to close (e.g., adjacent) blocks/elements through the parasitic bipolar transistor. In other words, the carriers (e.g., charges) may move from the first region I to the third region III due to the parasitic bipolar transistor. The first guard ring 162, the second guard ring 153, and the third guard ring 163, however, may be positioned between the first region I and the third region III, thereby blocking moving carriers. The charges may be captured in a depletion region generated by the first guard ring 162 and the second guard ring 153. Additionally, the third guard ring 163 may be provided for the purpose of extracting the charges having passed through the depletion region to the outside.

Referring to FIG. 7, the first guard ring 162 and the second guard ring 153 may be disposed closer to the source electrode 203 than to the drain electrode 201. This is because the charges moving from the drain electrode 201 to the source electrode 203 pass through the parasitic bipolar transistor. Accordingly, the first guard ring 162 and the second guard ring 153 may be capable of blocking more charges.

FIG. 8 illustrates operations of the first guard ring 162, the second guard ring 153, and the third guard ring 163. Referring to FIG. 8, reference numeral 330 denotes a conduction band, and reference numeral 340 denotes a valence band. Charges may pass (e.g., as illustrated by the charge movement 301) through the body 182 of a first conductivity type (or the sink 152 of the first conductivity type) from the drain electrode 201 and may gather in the first guard ring 162. Because a potential level of the second guard ring 153 may be higher than that of the first guard ring 162, the second guard ring 153 may serve as a potential barrier that impedes/prevents the charges from moving.

In addition, the third guard ring 163 may be provided for extracting the charges having passed through the first guard ring 162 and the second guard ring 153 to the second bias BIAS2. As shown in FIG. 8, a potential barrier level of the third guard ring 163 may be lower than that of the second guard ring 153.

Referring to FIGS. 7 and 8, the first bias BIAS1 may be applied to the first guard ring 162 and the second guard ring 153. However, as long as the second guard ring 153 serves as a potential barrier, any bias may be applied to the first guard ring 162 and the second guard ring 153. But, as shown in FIGS. 7 and 8, when the same first bias BIAS1 is applied to the first guard ring 162, the second guard ring 153, and the source electrode 203, a size of the semiconductor device 1 (e.g., a chip size) can be reduced. If a bias applied to the source electrode 203 is different from the bias applied to the first guard ring 162 and the second guard ring 153, a space for a buffer may be required.

Figure 9:
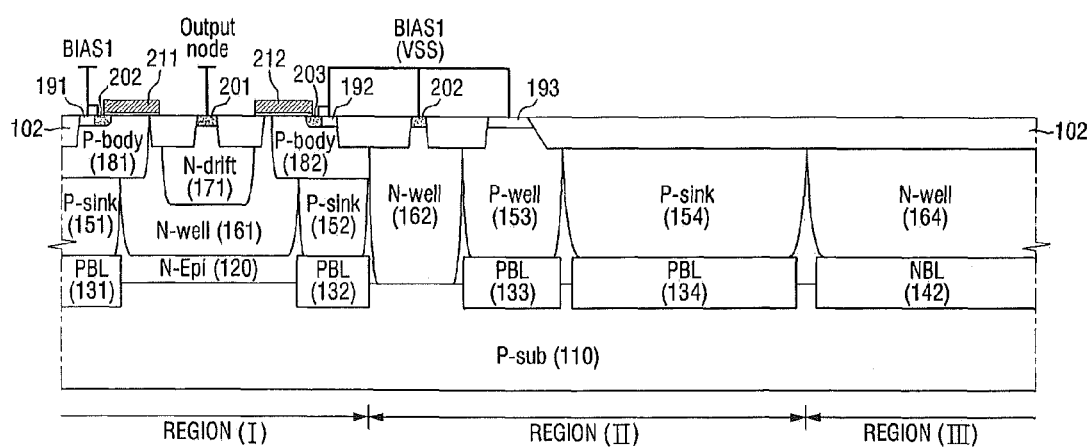
FIG. 9 is a cross-sectional view of a semiconductor device, according to various embodiments of the present inventive concepts.

FIG. 9 is a cross-sectional view of a semiconductor device 2 according to various embodiments of the present inventive concepts. Descriptions of features that are similar to those of the semiconductor device 1 of FIG. 7 may be omitted. Referring to FIG. 9, the semiconductor device 2 may include only a first guard ring 162 and a second guard ring 153. In other words, a third guard ring (e.g., the third guard ring 163 of FIG. 7) may be omitted. For example, if a quantity of carriers (e.g., charges) passing through a depletion region formed by the first guard ring 162 and the second guard ring 153 is not large enough to warrant an additional barrier, then the third guard ring 163 may be omitted. A first bias BIAS1 may be applied to the first guard ring 162 and the second guard ring 153. The first bias BIAS1 may be applied to a source electrode 203 of an LDMOS transistor as well.

Figure 10:
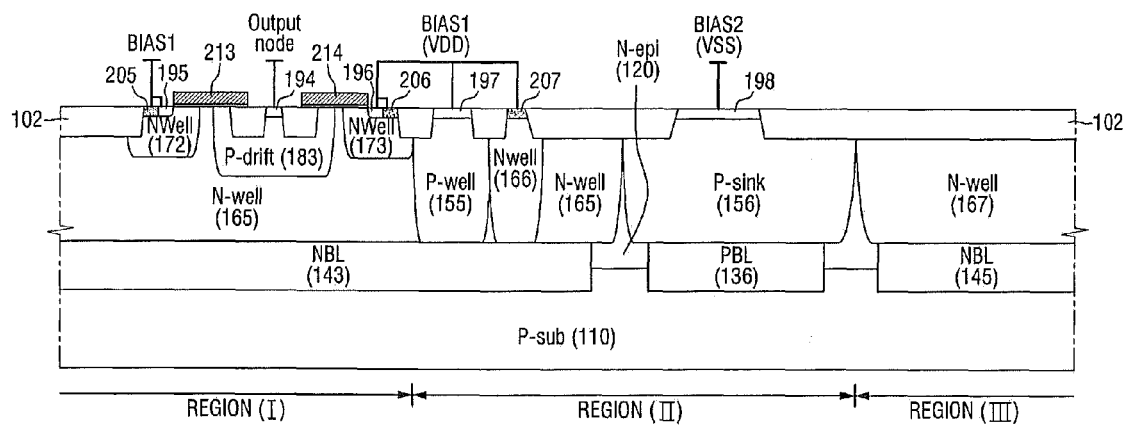
FIG. 10 is a cross-sectional view of a semiconductor device, according to various embodiments of the present inventive concepts.
Figure 11:
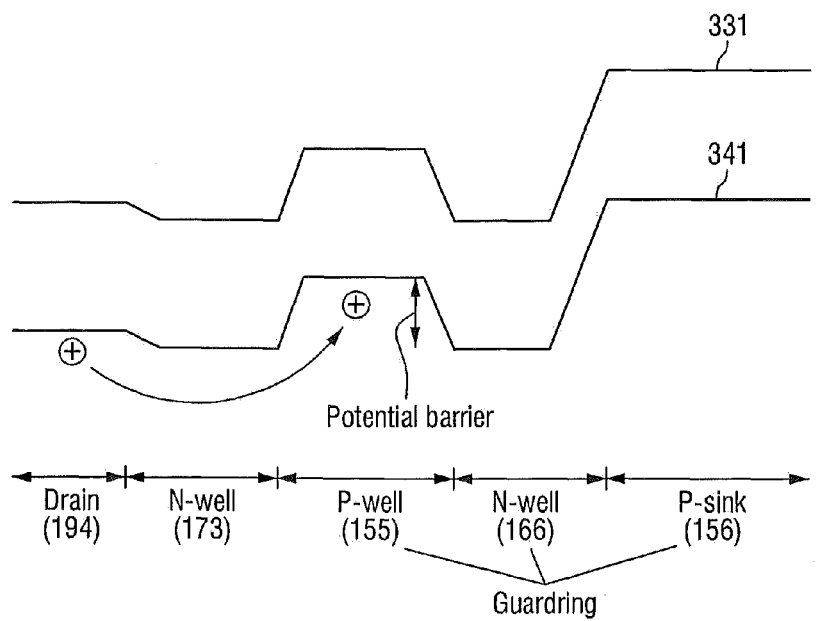
FIG. 11 is a potential diagram that illustrates operations of the semiconductor device of FIG. 10, according to various embodiments of the present inventive concepts.

FIG. 10 is a cross-sectional view of a semiconductor device 3 and FIG. 11 is a potential diagram illustrating operations of the semiconductor device 3, according to various embodiments of the present inventive concepts. Descriptions of features that are similar to those of the semiconductor device 1 of FIG. 7 may be omitted. Whereas a low-side N-type LDMOS transistor may be used as/in the semiconductor device 1 of FIG. 7, a P-type LDMOS transistor may be used as/in the semiconductor device 3 of FIG. 10.

Referring to FIG. 10, the semiconductor device 3 may include a first region I, a second region I,I and a third region III. An LDMOS transistor may be formed in the first region I. The third region III may include a block region close to (e.g., adjacent) the first region I. The second region II may be a region between the first region I and the third region III, and guard rings 155, 166, and 156 may be formed in the second region II.

In some embodiments, substrates 110 and 120 may include a base substrate 110 of a first conductivity type (e.g., P type) and an epi layer 120 of a second conductivity type (e.g., N type). A first buried layer (PBL) 136 of a first conductivity type (P type) and second buried layers (NBLs) 143 and 145 of a second conductivity type (N type) may be formed in the substrates 110 and 120. For example, some portions of the second buried layer 143 may be formed in the first region I, the first buried layer 136 and other portions the second buried layer 143 may be formed in the second region II, and the second buried layer 145 may be formed in the third region III.

A deep well 165 of second conductivity type (e.g., N type) may be formed in the first region I of the substrates 110 and 120. The LDMOS transistor of first conductivity type (e.g., P type) may include gate electrodes 213 and 214, a drain electrode 194, and source electrodes 195 and 196. The drain electrode 194 may be formed in a drift region 183 of the first conductivity type, and the source electrodes 195 and 196 may be formed in wells 172 and 173 of the second conductivity type, respectively. The drain electrode 194 may be connected to an output node, and the source electrodes 195 and 196 may be connected to a first bias BIAS1.

The first bias BIAS1 may be a power voltage VDD but is not limited thereto. As shown in the LDMOS transistor of FIG. 10, the source electrodes 195 and 196 may be disposed on/at opposite sides of the drain electrode 194, which may increase the current driving capacity of the LDMOS transistor. Ohmic contacts 205 and 206 of a second conductivity type (e.g., N type) may include portions to which the first bias BIAS1 is applied and may be formed close to (e.g., adjacent) the source electrodes 195 and 196 of the LDMOS. Moreover, although a well 167 of the second conductivity type may be formed in the third region III of the substrates 110 and 120, aspects of the present inventive concepts are not limited thereto.

A first guard ring 155 of a first conductivity type (e.g., P type), a second guard ring 166 of a second conductivity type (e.g., N type), and a third guard ring 156 of the first conductivity type may be formed in the second region II of the substrates 110 and 120. An ohmic contact 197 of the first conductivity type may be formed on the first guard ring 155, an ohmic contact 207 of the second conductivity type may be formed on the second guard ring 166, and the ohmic contact 198 of the first conductivity type may be formed on the third guard ring 156.

The first guard ring 155 may be formed close to (e.g., adjacent) the LDMOS transistor, the second guard ring 166 may be formed close to (e.g., adjacent) the first guard ring 155, and the third guard ring 156 may be formed close to (e.g., adjacent) the second guard ring 166. The first guard ring 155 may surround (e.g., form a perimeter around) the first region I in the substrate 110 and 120 where the LDMOS transistor is formed, and the first bias BIAS1 may be applied to the first guard ring 155. The second guard ring 166 may surround (e.g., form a perimeter around) the first guard ring 155 in the substrates 110 and 120, and the first bias BIAS1 may be applied to the second guard ring 166. The third guard ring 156 may surround (e.g., form a perimeter around) the second guard ring 166 in the substrates 110 and 120, and a second bias BIAS2 different from the first bias BIAS1 may be applied to the third guard ring 156. Moreover, the first bias BIAS1 may be applied to the source electrode 196 of the P-type LDMOS transistor of FIG. 10.

In addition, FIG. 10 illustrates that a depth of the first guard ring 155 and a depth of the second guard ring 166 may be substantially the same. For example, lowermost surfaces of the first and second guard rings 155 and 166, respectively, may be substantially coplanar. Alternatively, the first and second guard rings 155 and 166 may have different depths. Moreover, the first guard ring 155 and the second guard ring 166 may be disposed closer to the source electrode 196 than to the drain electrode 194. The first guard ring 155 and the second guard ring 166 may come into contact with the second buried layer 143. Accordingly, portions of the first guard ring 155 and the second guard ring 166 may overlap a portion of the second buried layer 143.

Referring now to FIG. 11, reference numeral 331 denotes a conduction band and reference numeral 341 denotes a valence band. Holes (e.g., as illustrated by the "+" symbol in FIG. 11) may pass through a well 173 of a second conductivity type (e.g., N type) from the drain electrode 194 and may gather in the first guard ring 155. Because a potential level of the second guard ring 166 may be lower than that of the first guard ring 155, the second guard ring 166 may serve as a potential barrier that impedes/prevents the holes from moving.

Figure 12:
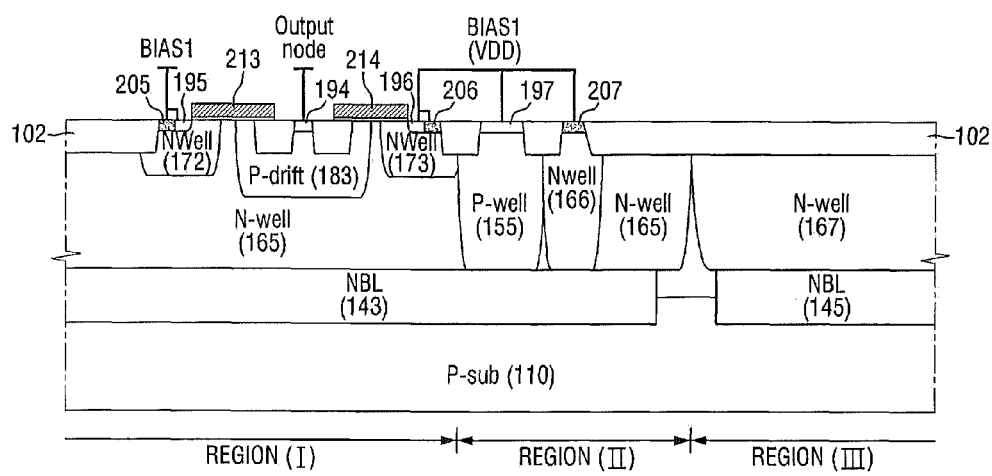
FIG. 12 is a cross-sectional view of a semiconductor device, according to various embodiments of the present inventive concepts.

FIG. 12 is a cross-sectional view of a semiconductor device according to various embodiments of the present inventive concepts. For simplicity of explanation, descriptions of features that are similar to those of the semiconductor device 3 of FIG. 10 may be omitted.

Referring to FIG. 12, the semiconductor device 4 may include only the first guard ring 155 and the second guard ring 166. In other words, the third guard ring 156 may be omitted. A first bias BIAS1 may applied to the first guard ring 155 and the second guard ring 166. The first bias BIAS1 may also be applied to a source electrode 196 of an LDMOS transistor of the semiconductor device 4. If a quantity of carriers (e.g., holes) passing through a depletion region formed by the first guard ring 155 and the second guard ring 166 is not large enough to warrant an additional barrier, then the third guard ring 156 may be omitted.

Figure 13:
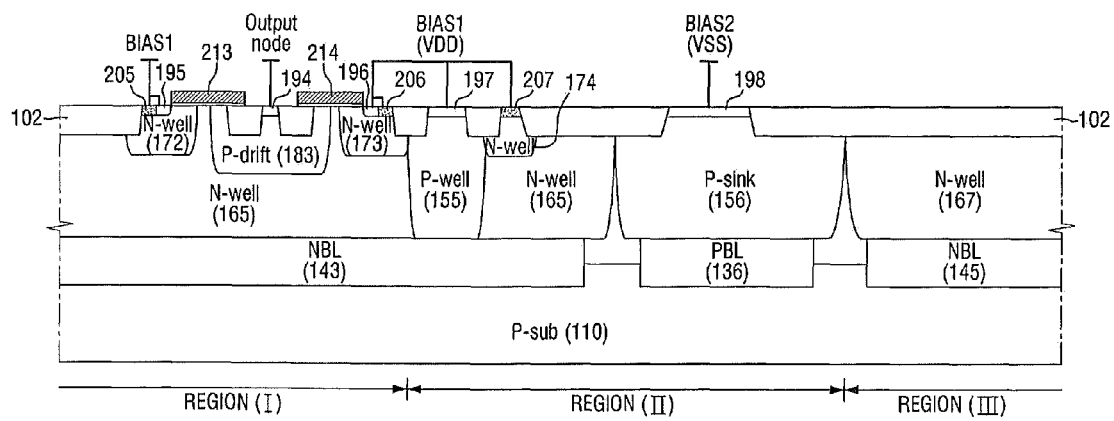
FIG. 13 is a cross-sectional view of a semiconductor device, according to various embodiments of the present inventive concepts.

FIG. 13 is a cross-sectional view of a semiconductor device 5 according to various embodiments of the present inventive concepts. For simplicity of explanation, descriptions of features that are similar to those of the semiconductor device 3 of FIG. 10 may be omitted.

Referring to FIG. 13, in the semiconductor device 5, a depth of a second guard ring 174 of a second conductivity type (e.g., N type) may be smaller/shallower than that of a first guard ring 155. For example, a depth of the second guard ring 174 may be substantially the same as a well 173 of the second conductivity type. As an example, the second guard ring 174 may be simultaneously formed with the well 173. The first guard ring 155 may come into contact with a second buried layer 143, whereas the second guard ring 174 may not come into contact with the second buried layer 143. For example, a well 165 of the second conductivity type may be between the second guard ring 174 and the second buried layer 143.

Figure 14:
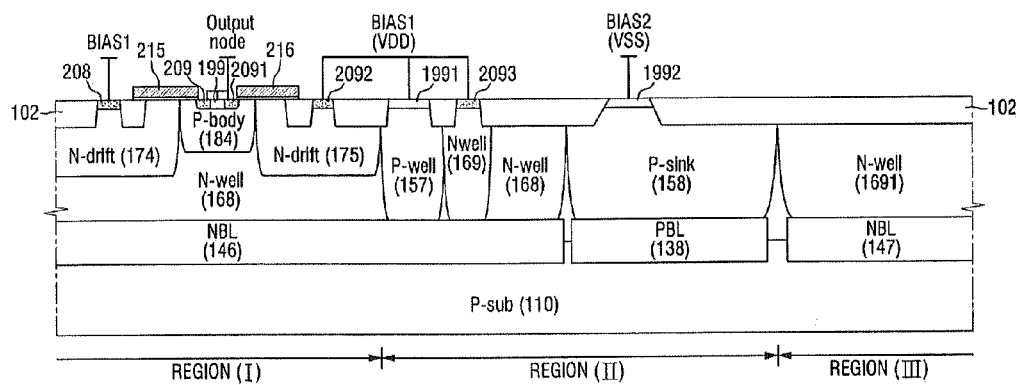
FIG. 14 is a cross-sectional view of a semiconductor device, according to various embodiments of the present inventive concepts.
Figure 15:
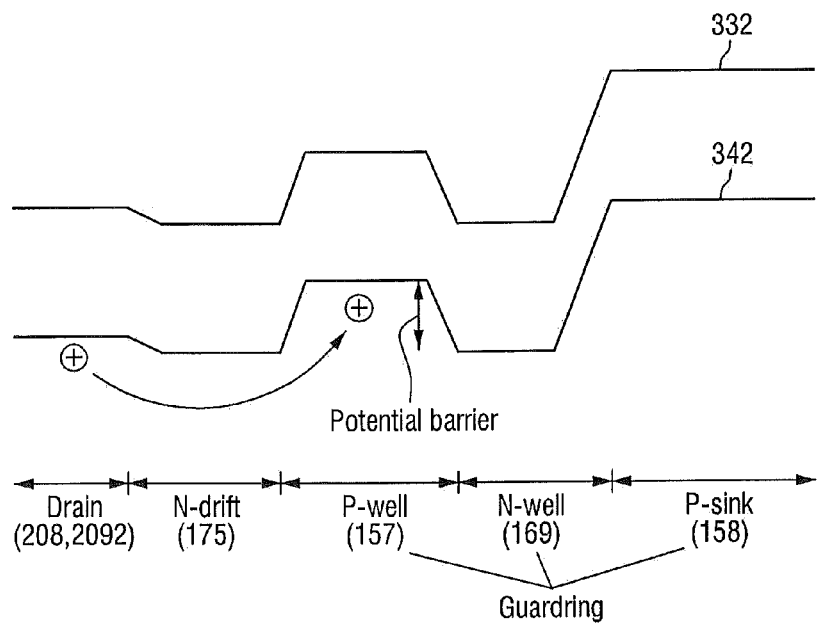
FIG. 15 is a potential diagram illustrating operations of the semiconductor device of FIG. 14, according to various embodiments of the present inventive concepts.

FIG. 14 is a cross-sectional view of a semiconductor device 6 and FIG. 15 is a potential diagram illustrating operations of the semiconductor device 6, according to various embodiments of the present inventive concepts. For simplicity of explanation, descriptions of features that are similar to those of the semiconductor device 1 of FIG. 7 may be omitted.

Whereas a low-side N-type LDMOS transistor may be used as/in the semiconductor device 1 in FIG. 7, a high-side N-type LDMOS transistor may be used as/in the semiconductor device 6 in FIG. 14. The "high-side" LDMOS transistor may be a pull up transistor.

Referring to FIG. 14, the semiconductor device 6 of FIG. 14 may include a first region I, a second region II, and a third region III. A high-side N-type LDMOS transistor may be formed in the first region I. The third region III may include a block region close to (e.g., adjacent) the first region I. The second region II may be between the first region I and the third region III, and guard rings 157, 169 and 158 may be formed in the second region II.

According to various embodiments, substrates 110 and 120 may include a base substrate 110 of a first conductivity type (e.g., P type) and an epi layer 120 of a second conductivity type (e.g., N type). A first buried layer (PBL) 138 of the first conductivity type (P type) and second buried layers (NBLs) 146 and 147 of the second conductivity type (N type) may be formed in the substrates 110 and 120. For example, some portions of the second buried layer 146 may be formed in the first region I, the first buried layer 138 and other portions of the second buried layers 146 may be formed in the second region II, and the second buried layer 147 may be formed in the third region III. A deep well 168 of the second conductivity type may be formed in the first region I of the substrates 110 and 120.

The LDMOS transistor of second conductivity type (e.g., N type) may include gate electrodes 215 and 216, drain electrodes 208 and 2092, and source electrodes 209 and 2091. The drain electrodes 208 and 2092 may be formed in drift regions 174 and 175 of the second conductivity type, and the source electrodes 209 and 2091 may be formed in a body 184 of first conductivity type. The source electrodes 209 and 2091 may be connected to an output node, and the drain electrodes 208 and 2092 may be connected to a first bias BIAS1. The first bias BIAS1 may be a power voltage VDD but is not limited thereto. As shown in FIG. 14, in the LDMOS transistor, the drain electrodes 208 and 2092 may be disposed on/at opposite sides (e.g., left and right sides, respectively) of the source electrodes 209 and 2091, which may increase the current driving capacity of the LDMOS transistor. For example, the source electrodes 209 and 2091 may be between the drain electrodes 208 and 2092. Also, the source electrodes 209 and 2091 may be on/at opposite sides of an ohmic contact 199. Moreover, a well 1691 of the second conductivity type may be formed in the third region III of the substrates 110 and 120, but aspects of the present inventive concepts are not limited thereto.

Referring still to FIG. 14, the first guard ring 157 of a first conductivity type (e.g., P type), the second guard ring 169 of a second conductivity type (e.g., N type), and the third guard ring 158 of the first conductivity type may be formed in the second region II of the substrates 110 and 120. An ohmic contact 1991 of the first conductivity type may be formed on the first guard ring 157, an ohmic contact 2093 of the second conductivity type may be formed on the second guard ring 169, and an ohmic contact 1992 of the first conductivity type may be formed on the third guard ring 158.

The first guard ring 157 may be formed close to (e.g., adjacent) the LDMOS transistor, the second guard ring 169 may be formed close to (e.g., adjacent) the first guard ring 157, and the third guard ring 158 may be formed close to (e.g., adjacent) the second guard ring 169. The first guard ring 157 may surround (e.g., form a perimeter around) the first region I in the substrate 110 and 120 where the LDMOS is formed, and the first bias BIAS1 may be applied to the first guard ring 157. The second guard ring 169 may surround (e.g., form a perimeter around) the first guard ring 157 in the substrates 110 and 120, and the first bias BIAS1 may be applied to the second guard ring 169. The third guard ring 158 may surround (e.g., form a perimeter around) the second guard ring 169 in the substrates 110 and 120, and a second bias BIAS2 different from the first bias BIAS1 may be applied to the third guard ring 158. Moreover, the first bias BIAS1 may be applied to a drain electrode 2092 of the N-type LDMOS transistor.

FIG. 14 further illustrates that a depth of the first guard ring 157 and a depth of the second guard ring 169 may be substantially the same. For example, lowermost surfaces of the first and second guard rings 157 and 169, respectively, may be substantially coplanar. Alternatively, a depth of the first guard ring 157 and a depth of the second guard ring 169 may be different. Moreover, the first guard ring 157 and the second guard ring 169 may be disposed closer to the drain electrode 2092 than to the source electrodes 209 and 2091. The first guard ring 157 and the second guard ring 169 may be formed to come into contact with the second buried layer 146. Accordingly, portions of the first guard ring 157 and the second guard ring 169 may overlap a portion of the second buried layer 146.

Referring now to FIG. 15, reference numeral 332 denotes a conduction band, and reference numeral 342 denotes a valence band. Holes (e.g., as illustrated by the "+" symbol) may pass through the drift region 175 of second conductivity type from the drain electrodes 208 and 2092 and gather in the first guard ring 157. Because a potential level of the second guard ring 169 may be lower than that of the first guard ring 157, the second guard ring 169 may serve as a potential barrier that impedes/prevents the holes from moving.

Figure 16:
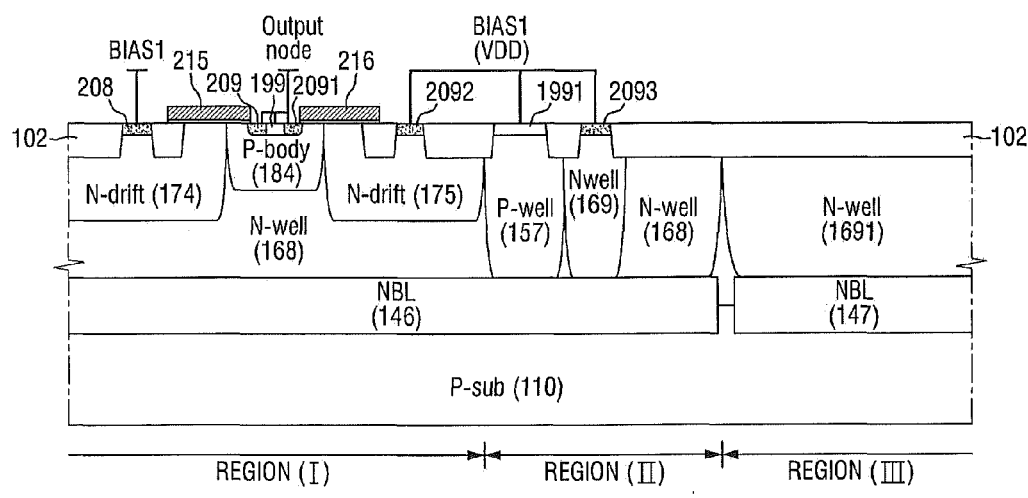
FIG. 16 is a cross-sectional view of a semiconductor device, according to various embodiments of the present inventive concepts.

FIG. 16 is a cross-sectional view of a semiconductor device 7 according to various embodiments of the present inventive concepts. For simplicity of explanation, descriptions of features that are similar to those of the semiconductor device 6 of FIG. 14 may be omitted. Referring to FIG. 16, the semiconductor device 7 may include a first guard ring 157 and a second guard ring 169 but may omit a third guard ring (e.g., the third guard ring 158 of FIGS. 14 and 15). For example, if a quantity of carriers (e.g., holes) passing through a depletion region formed by the first guard ring 157 and the second guard ring 169 is not large enough to warrant an additional barrier, then the third guard ring 158 may be omitted. A first bias BIAS1 may be applied to the first guard ring 157 and the second guard ring 169. Moreover, the first bias BIAS1 may be applied to a drain electrode 2092 of an LDMOS transistor in the semiconductor device 7 as well.

Figure 17:
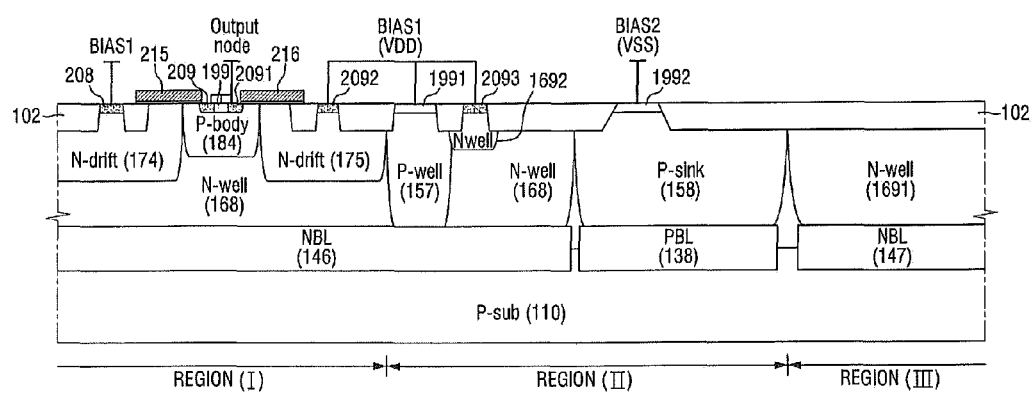
FIG. 17 is a cross-sectional view of a semiconductor device, according to various embodiments of the present inventive concepts.

FIG. 17 is a cross-sectional view of a semiconductor device 8 according to various embodiments of the present inventive concepts. For simplicity of explanation, descriptions of features that are similar to those of the semiconductor device 6 of FIG. 14 may be omitted. Referring to FIG. 17, in the semiconductor device 8, a depth of a second guard ring 1692 of a second conductivity type (e.g., N type) may be smaller/shallower than that of a first guard ring 157. For example, a lowermost surface of the second guard ring 1692 may be shallower than lowermost surfaces of drift regions 174 and 175 of second conductivity type, respectively. The first guard ring 157 may come into contact with a second buried layer 146, whereas the second guard ring 1692 may not come into contact with the second buried layer 146. As an example, an N-well 168 may be between the second guard ring 1692 and the second buried layer 146.

Figure 18:
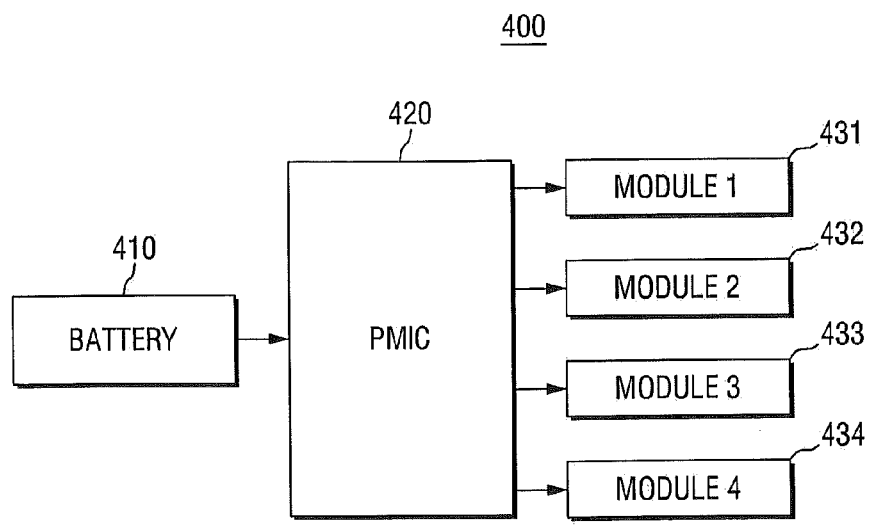
FIG. 18 is a block diagram of a semiconductor system, according to various embodiments of the present inventive concepts.

FIGS. 18 to 21 illustrate semiconductor systems using a semiconductor device according to various embodiments of the present inventive concepts. Referring to FIG. 18, a block diagram is provided of a semiconductor system 400 according to various embodiments. The semiconductor system 400 may include a battery 410, a power management IC (PMIC) 420, and a plurality of modules 431 to 434. The PMIC 420 may receives a voltage from the battery 410, converts the voltage into a voltage level required for the respective modules 431 to 434 and supplies the converted voltages to the respective modules 431 to 434. The PMIC 420 may include at least one of the semiconductor devices 1 to 8 described herein, according to various embodiments of the present inventive concepts.

Figure 19:
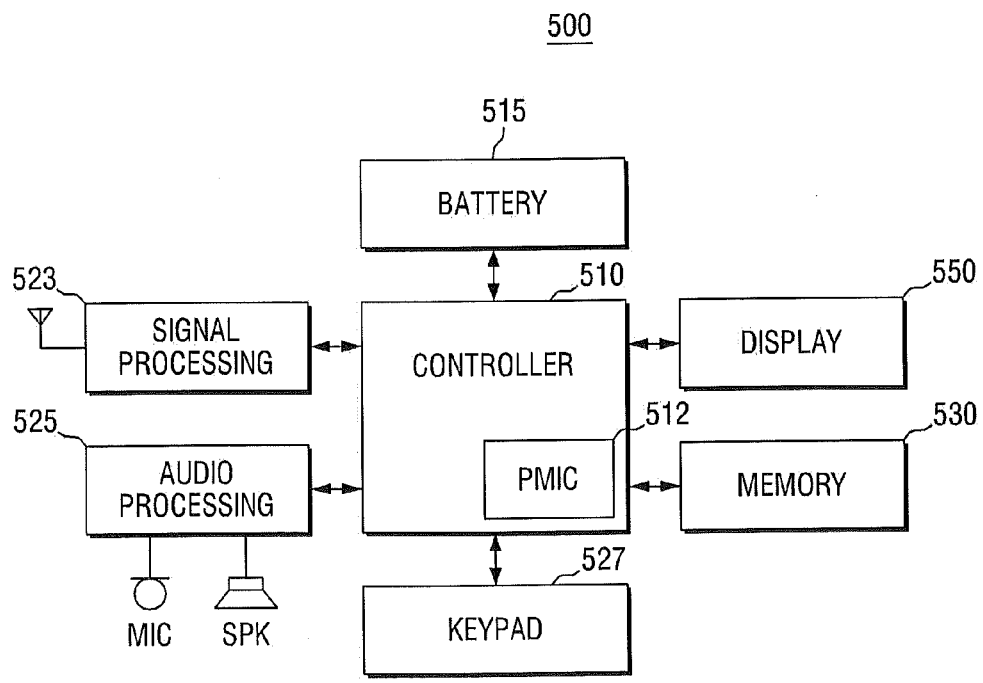
FIG. 19 is a block diagram of a semiconductor system, according to various embodiments of the present inventive concepts.

Referring to FIG. 19, a block diagram is provided of a semiconductor system 500 according to various embodiments. Referring to FIG. 19, the semiconductor system 500 may be a portable terminal. The portable terminal 500 may include a controller 510, a PMIC 512, a battery 515, a signal processing unit 523, an audio processing unit 525, a memory 530, and a display 550. In some embodiments, the portable terminal 500 may include a keypad 527 that includes keys for inputting numbers and/or text information and/or functional keys for setting various functions.

The signal processing unit 523 performs wireless communication of a portable terminal and may include a RF unit and a modem. The RF unit may include an RF transmitter that up-convert a frequency of a signal transmitted and an RF receiver that low-noise amplifies a signal received and down-converts a frequency. The modem may include a transmitter that encodes and modulates a signal transmitted and a receiver that demodulates and decodes the signal received from the RF unit.

The audio processing unit 525 of the portable terminal 500 may provide/cooperate with a codec, which may include a data codec and/or an audio codec. The data codec may process packet data, etc., and the audio codec may process an audio signal such as a voice or a multimedia file. In addition, the audio processing unit 525 may convert a digital audio signal received from a modem into a digital analog signal through the audio codec to reproduce the same (e.g., through a speaker (SPK)) or may convert an analog audio signal generated from a microphone (MIC) into a digital audio signal through the audio codec to then transmit the same to the modem. The codec may be separately provided or may be included in the controller 510 of the portable terminal.

The memory 530 may include a read-only memory (ROM) and/or a random-access memory (RAM). The memory 530 may include a program memory and/or data memories, which may store programs for controlling the operation of the portable terminal 500 and/or data for booting the portable terminal 500, respectively.

The display 550 may display a video signal and/or user data on a screen and/or display data associated with a telephone call. The display 550 may be a liquid crystal display (LCD) or an organic light emitting diode (OLED). When the LCD or OLED is implemented by/with touch screen capabilities, the display 550 may function as an input unit controlling the portable terminal 500 together with the keypad 527.

The controller 510 controls the overall operation of the portable terminal 500. The controller 510 may include the PMIC 512. The PMIC 512 may receive a voltage from the battery 515 and may convert the voltage into a required voltage level. The PMIC 512 may include at least one of the semiconductor devices 1 to 8 described herein, according to various embodiments of the present inventive concepts.

Figure 20:
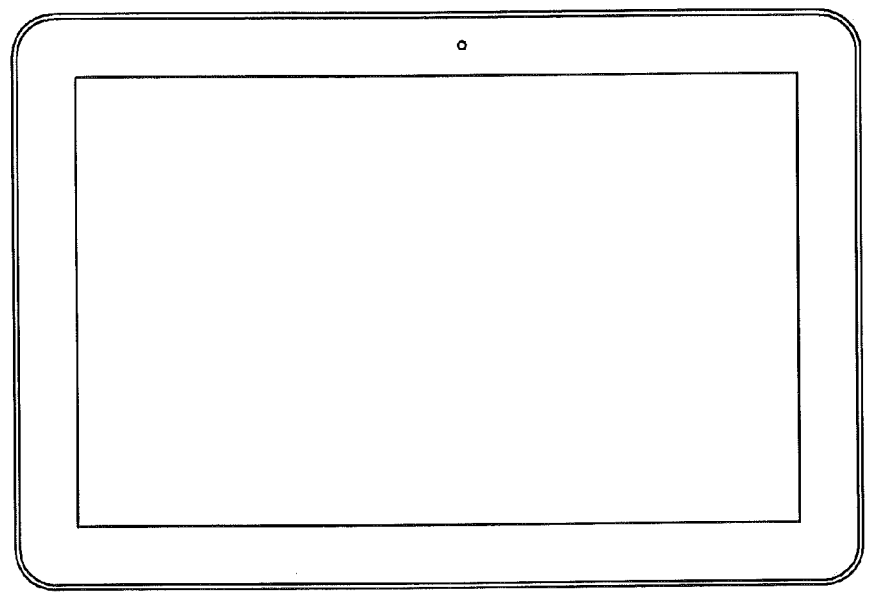
FIGS. 20 and 21 are conceptual diagrams for explaining semiconductor systems, according to various embodiments of the present inventive concepts.
Figure 21:
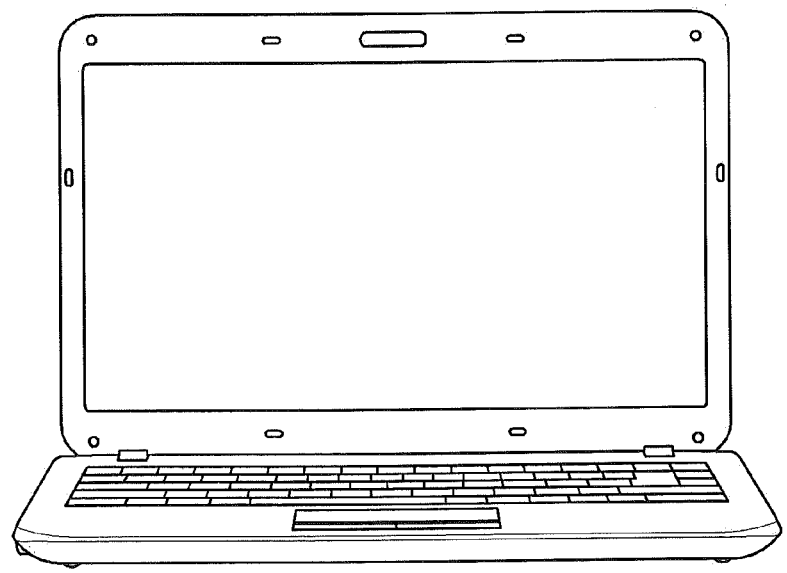

FIGS. 20 and 21 are conceptual diagrams of semiconductor systems according to various embodiments of the present inventive concepts. Specifically, FIG. 20 shows a tablet portable electronic computing device 2000 (e.g., a tablet personal computer (PC), and the like) and FIG. 21 shows a notebook PC 2100. At least one of the semiconductor devices 1 to 8 described herein may be used in the tablet PC 2000 or the notebook PC 2100. Moreover, it will be understood that the semiconductor devices 1 to 8 described herein may be applied to various other integrated circuits.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a substrate;
a transistor on the substrate, the transistor comprising a gate electrode, a source electrode, and a drain electrode;
a first guard ring of first conductivity type in the substrate adjacent the transistor; and
a second guard ring of second conductivity type opposite the first conductivity type in the substrate adjacent the first guard ring,
wherein the first guard ring, the second guard ring, and at least one of the source electrode and the drain electrode are configured to receive an equivalent bias,
wherein a depth of the first guard ring is greater in the substrate than a depth of the second guard ring, and
wherein the second guard ring is configured to block movement of charges from the drain electrode such that the charges gather in the first guard ring.

2. The semiconductor device of claim 1, wherein:
the first guard ring comprises a first well of the first conductivity type;
the second guard ring comprises a second well of the second conductivity type;
the semiconductor device further comprises a third guard ring comprising a third well of the first conductivity type;
the third guard ring is closer to the second guard ring than to the first guard ring;
the equivalent bias comprises a first bias; and
the third guard ring is configured to receive a second bias that is different from the first bias.

3. The semiconductor device of claim 2, wherein the first bias comprises one of a ground voltage and a power voltage, and the second bias comprises the other one of the ground voltage and the power voltage.

4. The semiconductor device of claim 1, wherein the first guard ring forms a perimeter around the transistor and the second guard ring forms a perimeter around the first guard ring.

5. The semiconductor device of claim 1, wherein:
the substrate comprises a base substrate and an epi layer of different respective conductivity types; and
a portion of the first guard ring and a portion of the base substrate overlap each other.

6. The semiconductor device of claim 1, further comprising:
a buried layer, of the second conductivity type, under the second guard ring in the substrate such that a portion of the second guard ring and a portion of the buried layer overlap each other.

7. The semiconductor device of claim 1, wherein:
the transistor comprises an N-type lateral double diffused metal oxide semiconductor (LDMOS) transistor;
the equivalent bias comprises a ground voltage; and
the source electrode comprises first and second source electrodes on opposite sides of the drain electrode, respectively.

8. The semiconductor device of claim 7, wherein the first guard ring is closer to the source electrode than to the drain electrode.

9. The semiconductor device of claim 1, wherein:
the transistor comprises a P-type lateral double diffused metal oxide semiconductor (LDMOS) transistor;
the equivalent bias comprises a power voltage; and
the source electrode comprises first and second source electrodes on opposite sides of the drain electrode, respectively.

10. The semiconductor device of claim 9, wherein the first guard ring is closer to the source electrode than to the drain electrode.

11. The semiconductor device of claim 1, wherein:
the transistor comprises an N-type lateral double diffused metal oxide semiconductor (LDMOS) transistor;
the equivalent bias comprises a power voltage;
the drain electrode comprises first and second drain electrodes; and
the source electrode is between the first and second drain electrodes.

12. The semiconductor device of claim 11, wherein the first guard ring is closer to the drain electrode than to the source electrode.

13. A semiconductor device comprising:
a first guard ring comprising a first well of first conductivity type, the first guard ring forming a perimeter around a transistor on a substrate and being configured to provide a first band potential level; and
a second guard ring comprising a second well of second conductivity type opposite the first conductivity type, the second guard ring forming a perimeter around the first guard ring and being configured to provide a second band potential level that is different from the first band potential level,
wherein the first and second guard rings are configured to receive an equivalent bias,
wherein the first and second guard rings are configured to simultaneously receive the equivalent bias, and
wherein the second well of the second guard ring has a more shallow depth in the substrate than a depth of the first well of the first guard ring in the substrate.

* * * * *